(12) United States Patent  (10) Patent No.: US 8,531,847 B2
Chang et al.  (45) Date of Patent: Sep. 10, 2013

(54) MOUNTING APPARATUS FOR EXPANSION CARDS

(75) Inventors: Chun-Wei Chang, New Taipei (TW); Jui-Feng Hu, New Taipei (TW); Ming-Ta Yu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 185 days.

(21) Appl. No.: 13/189,578

(22) Filed: Jul. 25, 2011

(65) Prior Publication Data

US 2012/0162884 A1    Jun. 28, 2012

(30) Foreign Application Priority Data

Dec. 23, 2010  (TW) ................................ 99145478 A

(51) Int. Cl.
*H05K 7/00* (2006.01)

(52) U.S. Cl.
USPC ................. 361/760; 361/679.04; 361/679.01; 361/755

(58) Field of Classification Search
USPC ........................ 361/760, 679.04, 679.01, 755
See application file for complete search history.

(56) References Cited

U.S. PATENT DOCUMENTS 6,970,363 B2 * 11/2005 Bassett et al. ................. 361/801
7,120,032 B2 * 10/2006 Lin et al. ....................... 361/801

* cited by examiner

*Primary Examiner* — Timothy Thompson
*Assistant Examiner* — Andargie M Aychillhum
(74) *Attorney, Agent, or Firm* — Altis Law Group, Inc.

(57) ABSTRACT

A mounting apparatus for an expansion card includes a shaft fixed to the expansion card, and a rotary member rotatably mounted to the shaft. The rotary member includes a cam, an operation portion opposite to the cam, and a latching portion formed between the cam and the operation portion. When fitting the expansion card to an expansion socket, the operation portion is operated to rotate the rotary member about the shaft, and the latching portion is latched to the expansion socket. When disassembling the expansion card from the expansion socket, the cam is levered against a top of the expansion socket to lift out the expansion card, thereby disassembling the expansion card from the expansion socket.

16 Claims, 5 Drawing Sheets

MOUNTING APPARATUS FOR EXPANSION CARDS

BACKGROUND

1. Technical Field

The disclosure relates to mounting apparatuses and, more particularly, to a mounting apparatus for mounting expansion cards.

2. Description of Related Art

A number of expansion cards are generally needed to be installed in an electronic device, such as a computer or a server. The expansion cards are typically assembled or disassembled by hand. However, space in the electronic device is limited, thus the manual maneuver in handling the expansion cards is inconvenient and often very difficult.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
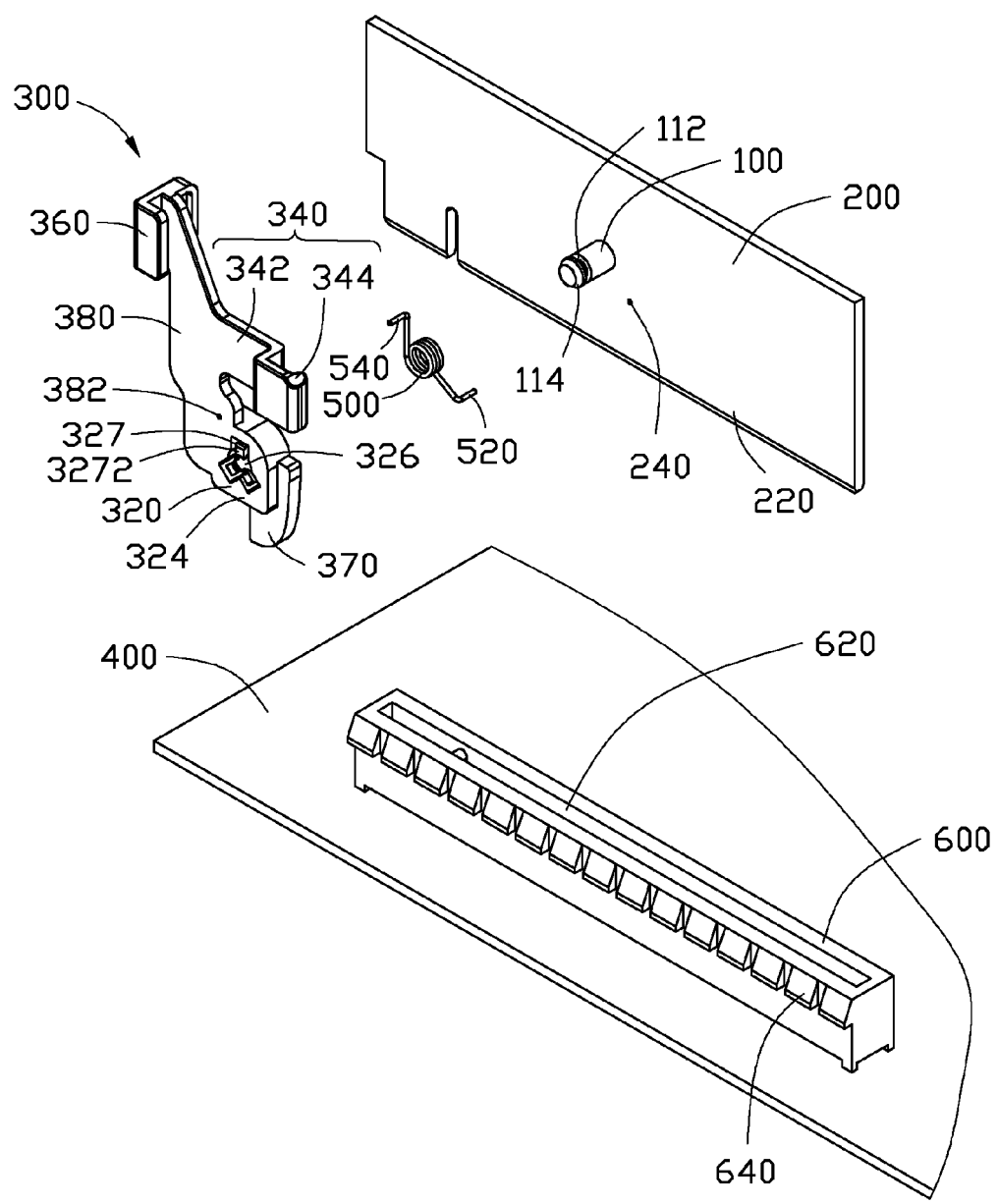
FIG. 1 is an exploded, isometric view of an exemplary embodiment of a mounting apparatus, together with an expansion card.
Figure 2:
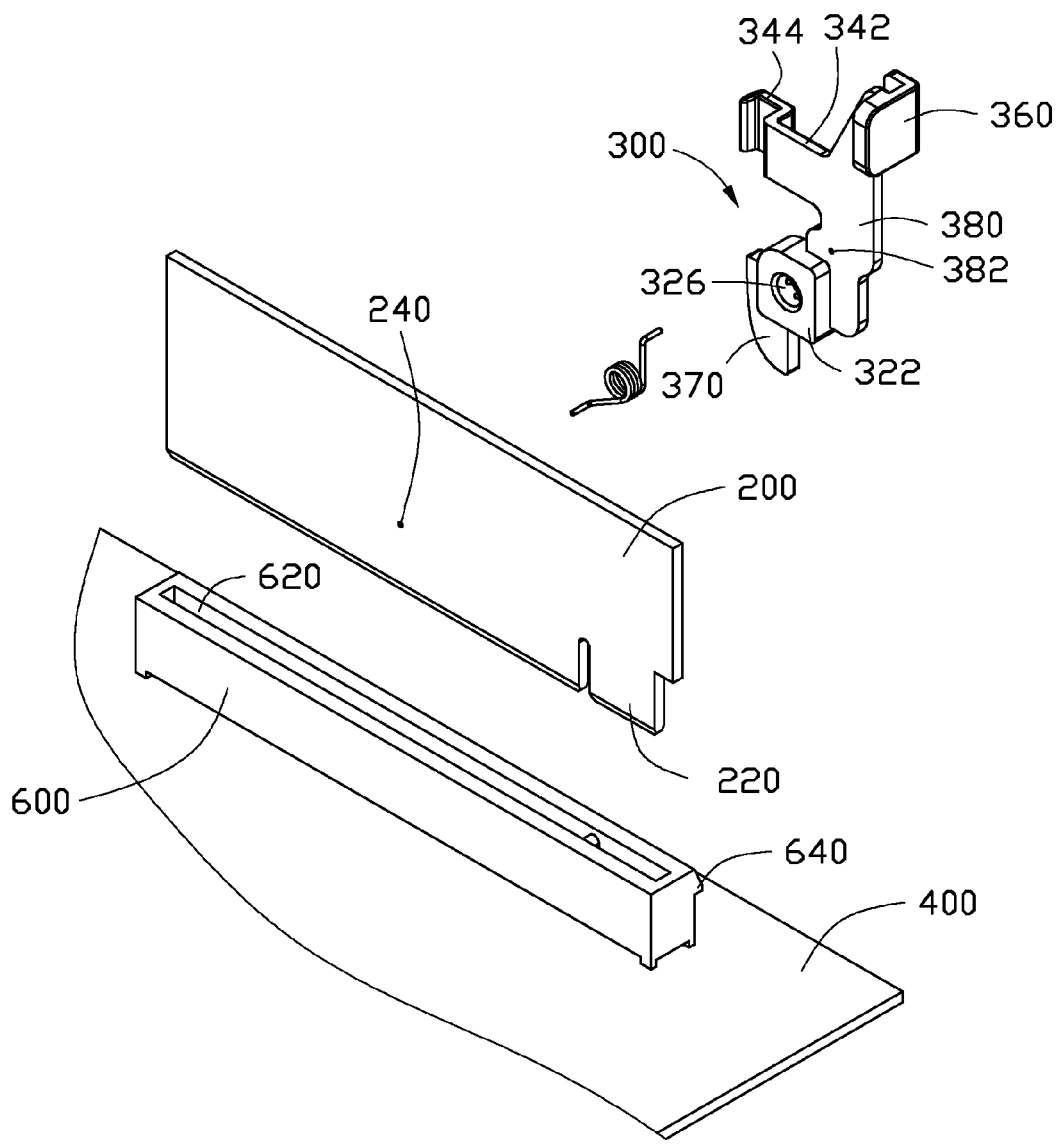
FIG. 2 is similar to FIG. 1, but viewed from another perspective.

Referring to FIGS. 1 and 2, an exemplary embodiment of a mounting apparatus is provided for mounting an expansion card 200 to an expansion socket 600 on a circuit board 400. The expansion socket 600 defines an elongated engaging slot 620 at the top of the expansion socket 600. A plurality of positioning blocks 640 protrude from a sidewall of the expansion socket 600. The expansion card 200 includes a plug portion 220 at a bottom of the expansion card 200. A small-diameter positioning hole 240 is defined in the expansion card 200, above the plug portion 220. In the embodiment, the circuit board 400 is positioned in a server (not shown), and only a part of the circuit board 400 is shown.

The mounting apparatus includes a shaft 100, a lever (rotary member 300), and a resilient member 500.

The shaft 100 is substantially cylindrical, and extends in a substantially perpendicular fashion from the expansion card 200. In one embodiment, the shaft 100 is fixed to the expansion card 200 by surface mount technology (SMT). A distal end of the shaft 100 forms a tapered guiding portion 114. The shaft 100 defines an annular engaging slot 112 at the distal end, adjacent to the guiding portion 114.

The rotary member 300 includes a substantially square base plate 320, a cam 370 protruding from a bottom and a sidewall neighboring the bottom of the base plate 320, an operation portion 360, a connecting plate 380 opposite to the cam 370 and connected between the base plate 320 and the operation portion 360, and a latching portion 340 extending from the connecting plate 380 above the cam 370 and the base plate 320. The base plate 320 includes an inner surface 322 facing the expansion card 200 and an outer surface 324. A shaft hole 326 is defined in the base plate 320, extending through the inner surface 322 and the outer surface 324. The outer surface 324 of the base plate 320 evenly defines three slots 327 communicating with the shaft hole 326. Three substantially L-shaped resilient tongues 3272 extend respectively from the bottoms of the slots 327. The distal ends of the tongues 3372 protrude into the shaft hole 326. A positioning hole 382 is defined in the connecting plate 380, adjacent to the base plate 320. The latching portion 340 includes a resilient extension portion 342 extending from the connecting plate 380, and a hook 344 extending from a distal end of the extension portion 342. A distal end of the hook 342 forms a guiding surface (not labeled).

In the embodiment, the resilient member 500 is a torsion spring. The resilient member 500 includes a first end 520 and a second end 540.

Figure 3:
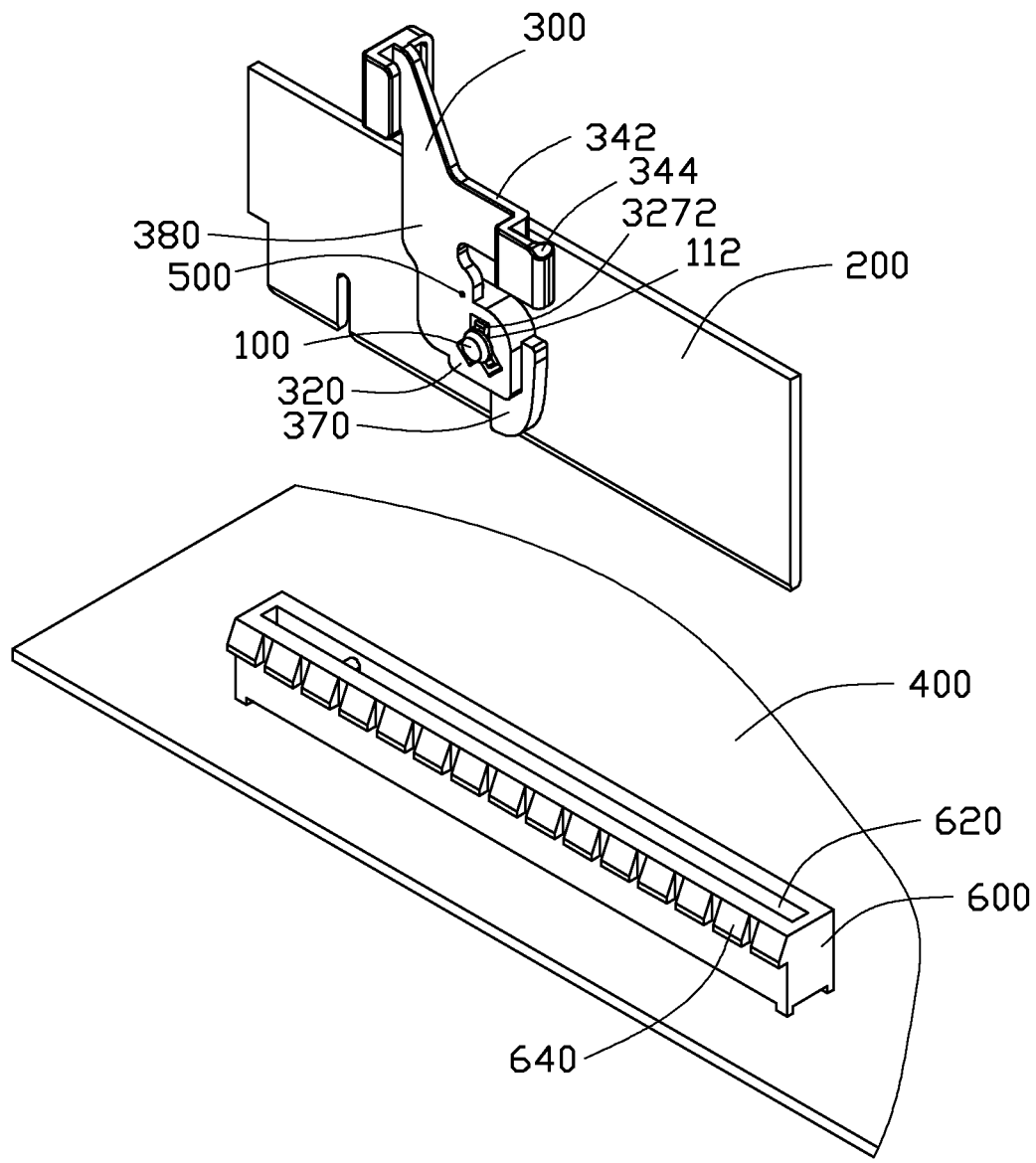
FIG. 3 is an isometric view of the partially assembled mounting apparatus of FIG. 1.

Referring to FIGS. 1-3, in assembly, the resilient member 500 is fitted about the shaft 100. The first end 520 of the resilient member 500 is inserted into the positioning hole 240 of the expansion card 200.

Through the shaft hole 326, the base plate 320 of the rotary member 300 is pivotably fitted about the shaft 100. The guide portion 114 of the shaft 100 abuts against and deforms the tongues 3272 as the guide portion is being fitted. After the tongues 3272 pass over the guide portion 114, the distal ends of the tongues 3272 are pivotably received in the engaging slot 112 of the shaft 100. The second end 540 of the resilient member 500 is inserted into the positioning hole 382 of the rotary member 300.

Figure 4:
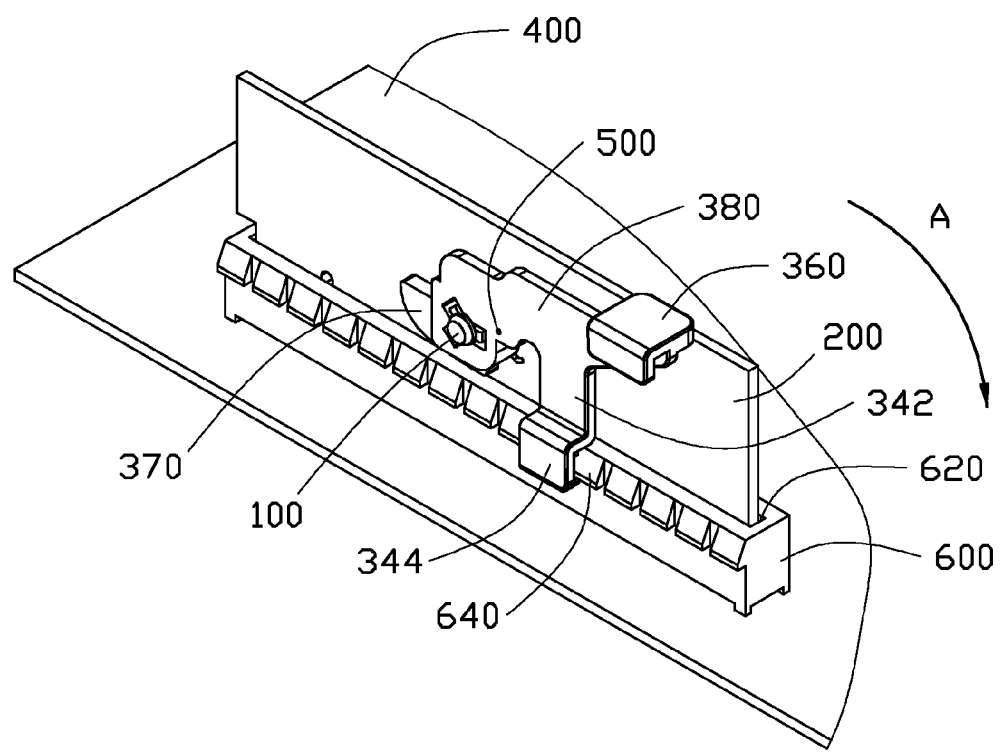
FIG. 4 is an isometric, assembled view of the mounting apparatus and the expansion card of FIG. 1.

Referring to FIG. 4, the expansion card 200 is in place in the expansion socket 600. The operation portion 360 of the rotary member 300 is pressed to rotate the rotary member 300 about the shaft 100 clockwise, shown as a first direction A. The cam 370 is pivoted away from the expansion socket 600. The plug portion 220 of the expansion card 200 is inserted into the engaging slot 620 of the expansion socket 600. The operation portion 360 is further pressed along the first direction A, the guide surface of the hook 344 of the latching portion 340 abuts against the outer surfaces of the corresponding positioning blocks 640, deforming the extension portion 342 and the resilient member 500, until the hook 344 passes over the corresponding positioning blocks 640. Then, the hook 344 of the latching portion 340 is latched with the bottom portions of the corresponding positioning blocks 640.

Figure 5:
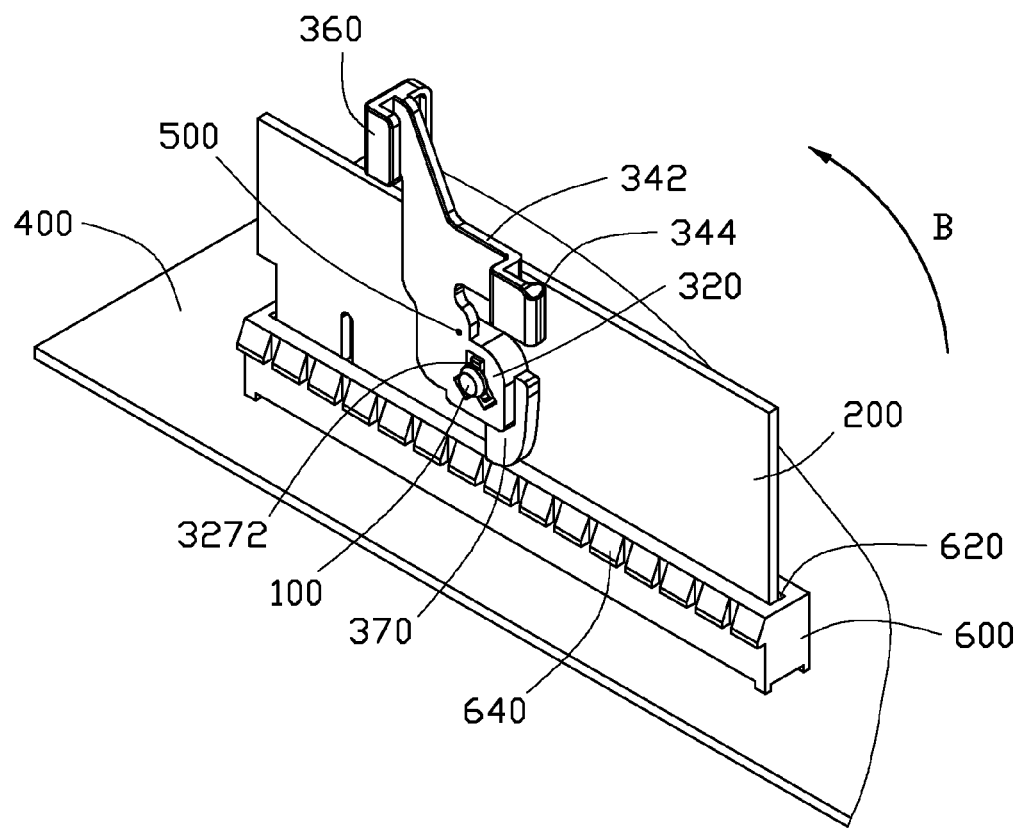
FIG. 5 is similar to FIG. 4, but showing a different state of use.

Referring to FIG. 5, when the expansion card 200 needs to be disassembled, the operation portion 360 of the rotary member 300 is deformed away from the expansion card 200. The hook 344 of the latching portion 340 is disengaged from the corresponding positioning blocks 640 of the expansion socket 620. The resilient member 500 exerts pressure on the rotary member 300 to rotate anticlockwise back, shown as a second direction B, until the cam 370 binds against the top surface of the expansion socket 600. The operation portion 360 is pressed-anticlockwise further, to further rotate the rotary member 300. The cam 370 abuts against the top surface of the expansion slot 300 to lever up the expansion card 200, until the plug portion 220 of the expansion card 200 is clear of the engaging slot 620 of the expansion socket 600.

While the disclosure has been described by way of examples and in terms of the embodiments, it is to be understood that the disclosure is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A mounting apparatus comprising:
    a shaft to be fixed to an expansion card; and
    a rotary member comprising a base plate pivotably fitting about the shaft, a cam, and an operation portion;
    wherein the shaft is located between the cam and the operation portion, when disassembling the expansion card from an corresponding expansion socket, the operation portion is operated to rotate the rotary member about the shaft, the cam abuts against a top of the expansion socket to move up the expansion card, thereby disassembling the expansion card from the expansion socket;
    wherein a distal end of the shaft away from the expansion card forms a tapered guiding portion; and
    wherein the shaft defines an annular engaging slot therein, adjacent to the guiding portion, an outer surface of the base plate opposite to the expansion card defines a slot communicating with the shaft hole, a resilient tongue extends from a bottom of the slot, and a distal end of the tongue is pivotably received in the engaging slot.

2. The mounting apparatus of claim 1, wherein the rotary member further comprises a connecting plate opposite to the cam and connected between the base plate and the operation portion, and the cam protrudes from the base plate.

3. The mounting apparatus of claim 2, wherein the shaft is substantially column-shaped, and substantially perpendicularly extends from the expansion card, a shaft hole is defined in the base plate to pivotably fitting about the shaft.

4. The mounting apparatus of claim 1, wherein the shaft is fixed to the expansion card by surface mounted technology (SMT).

5. The mounting apparatus of claim 1, further comprising a resilient member connected between the expansion card and the rotary member, to bias the cam of the rotary member to resist against the top of the expansion socket.

6. The mounting apparatus of claim 5, wherein the resilient portion is a torsion spring fitting about the shaft and located between the expansion card and the rotary member, a first end of the torsion spring is latched to the expansion card, a second end of the torsion spring is latched to the rotary member.

7. An apparatus for assembling an expansion card to an expansion socket, the apparatus comprising:
    a shaft to be fixed to the expansion card; and
    a rotary member rotatably fitting about the shaft, and comprising a cam, an operation portion opposite to the cam, and a latching portion formed between the cam and the operation portion;
    wherein the cam and the operation portion are located at opposite sides of a rotation connection of the rotary member and the expansion card, when assembling the expansion card to the expansion socket, the operation portion is operated to rotate the rotary member in a first direction to move the cam away from the expansion socket, the expansion card is engaged in the expansion socket, the latching portion is rotated in the first direction further to make the latching portion be latched to the expansion socket; when disassembling the expansion card from the expansion socket, the operation portion is operated to rotate in a second direction opposite to the first direction to release the latching portion from the expansion socket, and the cam abuts against a top of the expansion socket to move up the expansion card, thereby disassembling the expansion card from the expansion socket.

8. The apparatus of claim 6, wherein the rotary member further comprises a base plate pivotably fitting about the shaft and a connecting plate opposite to the cam and connected between the base plate and the operation portion, the cam protrudes from the base plate, the latching portion comprises a resilient extension portion extending from the connecting plate, and a hook extending from a distal end of the extension portion to be detachably latched to the expansion socket.

9. The apparatus of claim 8, wherein the shaft is substantially cylindrical, and substantially perpendicularly extends from the expansion card, a shaft hole is defined in the base plate, to rotatably fitting about the shaft.

10. The apparatus of claim 9, wherein a distal end of the shaft away from the expansion card forms a tapered guiding portion.

11. The apparatus of claim 10, wherein the shaft defines an annular engaging slot therein, adjacent to the guiding portion, an outer surface of the base plate opposite to the expansion card defines two slots communicating with the shaft hole, two resilient tongues respectively extend from bottoms of the slots, and distal ends of the tongues are pivotably received in the engaging slot.

12. The apparatus of claim 11, wherein the shaft is fixed to the expansion card by surface mounted technology (SMT).

13. The apparatus of claim 7, further comprising a resilient member, wherein the rotary member is rotatably fitted about the shaft, the resilient member fits about the shaft and located between the expansion card and the rotary member, to bias the cam to resist against the top of the expansion socket.

14. The apparatus of claim 13, wherein the resilient portion is a torsion spring, a first end of the torsion spring is latched to the expansion card, a second end of the torsion spring is latched to the rotary member.

15. An assembly comprising:
    a circuit board comprising an expansion socket, the expansion socket defining an elongated expansion slot, and comprising a positioning block at a side of the expansion slot;
    an expansion card comprising a plug portion at a bottom of the expansion card to be detachably engaged in the expansion slot of the expansion socket;
    a shaft to be fixed to the expansion card; and
    a rotary member pivotably mounted to the expansion card, the rotary member comprising a cam, and a latching portion;
    wherein when assembling the expansion card to the expansion socket, the plug portion of the expansion card is engaged in the expansion slot of the expansion socket, the latching portion is latched to the positioning block; and
    wherein when disassembling the expansion card from the expansion socket, the latching portion is released from the positioning block, the rotary member is rotated to make the cam resist against a top of the expansion socket to move up the expansion card, thereby making the plug portion disengage from the expansion slot, wherein the shaft substantially perpendicularly extends from the expansion card, above the plug portion, the rotary member pivotably fits about the shaft.

16. The assembly of claim 15, further comprising a torsion spring fitting about the shaft, to bias the cam of the rotary member to resist against the top of the expansion socket.

\* \* \* \* \*